United States Patent
Chen et al.

(10) Patent No.: US 9,401,434 B2
(45) Date of Patent: Jul. 26, 2016

(54) E-FLASH CELL BAND ENGINEERING FOR ERASING SPEED ENHANCEMENT

(71) Applicant: Taiwan Semiconductor Manufacturing Co., Ltd., Hsin-Chu (TW)

(72) Inventors: Chih-Ming Chen, Hsinchu (TW); Tsu-Hui Su, Taipei (TW); Szu-Yu Wang, Hsinchu (TW); Chung-Yi Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/489,902

(22) Filed: Sep. 18, 2014

(65) Prior Publication Data
US 2016/0087106 A1   Mar. 24, 2016

(51) Int. Cl.
| H01L 29/788 | (2006.01) |
| H01L 29/792 | (2006.01) |
| H01L 29/423 | (2006.01) |
| H01L 29/66 | (2006.01) |
| H01L 29/40 | (2006.01) |

(52) U.S. Cl.
CPC .......... *H01L 29/7883* (2013.01); *H01L 29/401* (2013.01); *H01L 29/42328* (2013.01); *H01L 29/42332* (2013.01); *H01L 29/42344* (2013.01); *H01L 29/66825* (2013.01); *H01L 29/66833* (2013.01); *H01L 29/792* (2013.01)

(58) Field of Classification Search
CPC ................ B82Y 10/00; H01L 29/7887; H01L 29/42324; H01L 21/28273; H01L 21/28282
USPC .................. 257/311, 314, 315, 321
See application file for complete search history.

(56) References Cited

U.S. PATENT DOCUMENTS

| 5,852,306 A | 12/1998 | Forbes |
| 6,774,061 B2 | 8/2004 | Coffa et al. |
| 7,101,760 B1 | 9/2006 | Lojek |
| 7,579,646 B2 | 8/2009 | Wang et al. |
| 2002/0140022 A1* | 10/2002 | Lin ...................... H01L 29/7887 257/315 |
| 2003/0075756 A1* | 4/2003 | Suzuki .............. H01L 29/42324 257/315 |
| 2006/0046383 A1* | 3/2006 | Chen ....................... B82Y 10/00 438/257 |
| 2006/0251561 A1 | 11/2006 | Farrell et al. |
| 2007/0145468 A1* | 6/2007 | Majumdar .............. B82Y 10/00 257/316 |
| 2008/0121966 A1 | 5/2008 | Muralidhar et al. |
| 2009/0039407 A1* | 2/2009 | Vora .................. H01L 27/11556 257/316 |
| 2010/0155909 A1* | 6/2010 | Ramappa .......... H01L 21/28282 257/637 |
| 2011/0263129 A1 | 10/2011 | Shin et al. |
| 2012/0267616 A1 | 10/2012 | Jang et al. |
| 2012/0267699 A1* | 10/2012 | Kiyotoshi ......... H01L 27/11524 257/319 |

(Continued)

OTHER PUBLICATIONS

Non-Final Office Action dated Jul. 10, 2015 in connection with U.S. Appl. No. 14/261,539.

(Continued)

*Primary Examiner* — Reema Patel
*Assistant Examiner* — Syed Gheyas
(74) *Attorney, Agent, or Firm* — Eschweiler & Associates, LLC

(57) ABSTRACT

The present disclosure relates to a structure and method for forming a flash memory cell with an improved erase speed and erase current. Si dots are used for charge trapping and an ONO sandwich structure is formed over the Si dots. Erase operation includes direct tunneling as well as FN tunneling which helps increase erase speed without compensating data retention.

20 Claims, 6 Drawing Sheets

(56) References Cited

U.S. PATENT DOCUMENTS

2012/0292683 A1 11/2012 Loiko et al.
2013/0207053 A1 8/2013 Gonen Williams et al.
2013/0207174 A1* 8/2013 Wang ............... H01L 21/28273
257/316

OTHER PUBLICATIONS

Jan Schmidt, et al.; "Surface Passivation of Silicon Solar Cells Using Plasma-Enhanced Chemical-Vapour-Deposited SiN Films and Thin Thermal SiO2/Plasma SiN Stacks"; Semiconductor Science and Technology; 2001; p. 164-170.
John Phelan; "Investigating the Influence of Interface and Vacancy Defects on the Growth of Silicon Quantum Dots in SiO2"; The School of Graduate and Postdoctoral Studies, The University of Western Ontario; 2013; p. 1-53.
U.S. Appl. No. 14/583,291, filed Dec. 26, 2014.
Crippa, et al. "Nonvolatile Memories: NOR vs. NAND Architectures." Memories in Wireless Systems, Springer-Verlag Berlin Heidelberg, 2008.
Li, et al. "Fabrication and Properties of Nano-Si Quantum Dot Flash Memory." Solid-State and Integrated Circuit Technology, 2006. ICSICT '06. 8th International Conference. Oct. 2006.
Muralidhar, et al. "A 6V Embedded 90nm Silicon Nanocrystal Non-volatile Memory." Electron Devices Meeting, 2003. IEDM '03 Technical Digest. IEEE International. Dec. 2003.
www.semiconductor-today.com "Flash Fast Forward to Quantum Dot Memory." Semiconductor Today—Compounds and Advanced Silicon, vol. 3, Issue 5, Jun. 2008.
Chang, Ko Min. "SG-TFS: a Versatile Embedded Flash with Silicon Nanocrystals as the Storage Medium." Solid-State and Integrated-Circuit Technology, 2008. ICSICT 2008. 9th International Conference. Oct. 2008.
P. Chakraborty, et al.; "Nanocrystal Non-Volatile Flash Memory Devices: A Simulation Study"; IETE Mumbai Centre, Electronics and ECE Department, Kharagpur, India; 2007; p. D-46-D-50.
Wang, et al. "Efficient One-Pot Synthesis of Highly Photoluminescent Alkyl-Functionalised Silicon Nanocrystals." Chem, Commun., 2011, 47, 4941-4943. Published in 2011.
Wang, et al. "A General Strategy for Nanocrystal Synthesis." Nature. vol. 437, Sep. 1, 2005, doi:10.1038/nature03968.
Bigioni, et al. "Kinetically Driven Self Assembly of Highly Ordered Nanoparticlemonolayers." Nature Materials, vol. 5, Apr. 2006.
Sletnes, et al. "Octoxy Capped Si Nanoparticles Synthesized by Homogeneous Reduction of SiCl4 with Crown Ether Alkalide." Royal Society of Chemistry, Dalton Trans., 2014, 43, 2127. Published in 2014.
U.S. Appl. No. 14/261,539, filed Apr. 25, 2014.
U.S. Appl. No. 14/308,808, filed Jun. 19, 2014.
Final Office Action Dated Oct. 22, 2015 U.S. Appl. No. 14/261,539.
Non Final Office Action Dated Oct. 14, 2015 U.S. Appl. No. 14/308,808.
Final Office Action Dated Feb. 16, 2016 U.S. Appl. No. 14/308,808.
Non Final Office Action Dated Apr. 21, 2016 U.S. Appl. No. 14/583,291.

* cited by examiner

E-FLASH CELL BAND ENGINEERING FOR ERASING SPEED ENHANCEMENT

BACKGROUND

Flash memory is used in a wide variety of electronic applications. Some flash memory cells utilize a floating gate field-effect transistor (FET), which stores one or more bits of data in the form of an electric charge within a "floating" gate. The floating gate resides above a channel of, and below a control gate of, the FET, but is electrically-isolated from both by an oxide layer. The memory cell stores charge when the FET is in an "on" state (i.e., when current flows between the source and drain) by applying a voltage to the control gate, which causes electrons to tunnel from the channel into the floating gate. Because the floating gate is electrically-isolated from the channel and the control gate, electrons that tunnel into it will remain there indefinitely.

Electric charge trapped within the floating gate screens the electric field from the control gate within the channel, which selectively changes the threshold voltage ($V_t$) of the FET. For flash memory devices that use an array of memory cells, the stored data can be read out of the array by measuring which cells have a higher $V_t$ (e.g., store a "1") and which have a lower $V_t$ (e.g., store a "0"). Multi-bit cells are also possible, where a single memory cell has more than two discrete $V_t$ states corresponding to more than two data states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
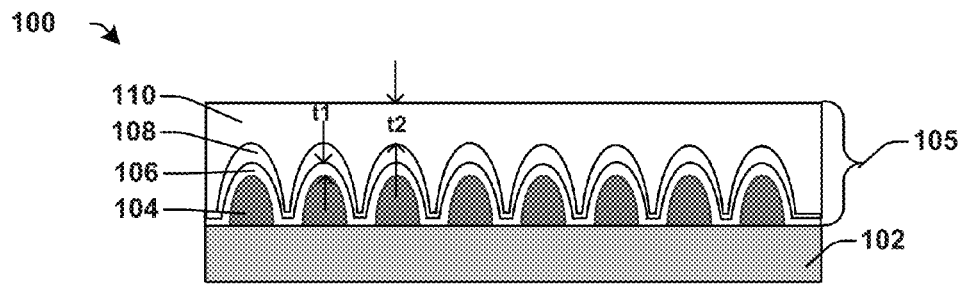
FIG. 1 illustrates a cross sectional view of a charge trapping structure where an ONO sandwich structure resides over a plurality of silicon nano crystals, according to some embodiments of the present disclosure.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical flash memory comprises a memory array having a large number of memory cells arranged in blocks. One of the most commonly known flash memories is the one-transistor flash memory, wherein each of the memory cells is fabricated as a field-effect transistor having a control gate and a floating gate. In some technologies, a layer of silicon (Si) dots, which are sandwiched between a bottom (tunnel) oxide layer and a top (control) oxide layer, act as the floating gate. Charge, in the form of electrons or holes, can become selectively trapped on (or selectively stripped from) the layer of Si dots based on the bias conditions applied to the flash memory cell. Ideally, for each flash memory cell, the layer of Si dots would store same discrete charge levels for respective programmed data states. With the nano crystals sandwiched between the top and bottom oxides, the erase is bi-directional or charge carriers can leave the nano crystals in both directions. i.e., during erase operation, charge from the nano crystals can be pushed through the bottom oxide into the channel region or through the top oxide into the control gate (CG) region. Erase operation through the top oxide or top erase can be realized by applying a positive voltage at the CG while the drain is floated (0V), and erase operation through the bottom oxide or bottom erase can be realized by applying a negative voltage at the CG while the drain is floated (0V).

Many memories, including flash memories, use Fowler-Nordheim (FN) tunneling to erase a memory cell. In flash memory cell, FN tunneling is said to have occurred when electrons tunnel from semiconductor conduction band into the top or bottom oxide conduction band through part of the potential barrier at the semiconductor-oxide interface, which occurs at very high electric field in the oxide. Usually, FN tunneling dominates when the oxide thickness is in the range of 5-10 nm.

Unfortunately, FN tunneling leads to slow erase speeds in flash. This is because a large tunneling distance is experienced with a very low tunneling probability for electrons attempting to leave the Si dots. This results in long erase times since the net flux of electrons leaving the gate is low. Thus, the tunneling current discharging the gate is low. The long erase times also lead to backside FN tunneling through the tunnel/bottom oxide. That is, if a sufficiently high electric field exists for a sufficiently long duration, electrons from the channel region might FN tunnel or leak through the tunnel oxide into the charge trapping layer causing variations in erase operation voltages and currents. However, FN tunneling has low retention leakage under low electric fields and thus provides good data retention.

An alternating tunneling method/model that could be utilized for erase operations is a direct tunneling model. Direct tunneling in a flash memory cell occurs when electrons from the conduction band of the semiconductor are transferred across the oxide directly (i.e. without changing energy) into the conduction band of a neighboring low energy layer. Direct tunneling dominates when the oxide thickness is less than 4 nm. If only direct tunneling were used in flash erase operation, a high erase current and high erase speed could be observed under a high electric field, but at low electric field or at retention, there will be high charge leakage through the thin oxides (during retention, the charge is retained in the charge trapping layer).

Accordingly, the present disclosure relates to a new structure and processing method that utilizes both FN tunneling and direct tunneling for its erase operation, so that erase efficiency is enhanced without sacrificing data retention. Here, an ONO sandwich structure is used as the top oxide such that different layers of the sandwich structure trigger both FN tunneling and direct tunneling. The ONO top oxide comprises a layered structure with an oxide (O) over a nitride (N) over another oxide (O). Direct tunneling through the first oxide layer residing over the silicon dot, gives high erase speed and a high erase current. These electrons further undergo FN tunneling through the second oxide layer residing over the nitride layer (under the same electric field). Since the erase speed is high, gate voltage could be effectively reduced which reduces backside FN tunneling through the tunnel oxide. Although some implementations are illustrated below with regards to split gate thin film storage embedded flash (SG TFS e-flash) memory, it will be appreciated that this concept is not limited to split gate flash memory cells, but is also applicable to other types of flash memory cells as well.

FIG. 1 illustrates a cross sectional view of a charge trapping structure 100 for flash memory, where an ONO sandwich structure resides over a plurality of silicon nano crystals, according to some embodiments of the present disclosure. Charge trapping structure 100 comprises a tunnel oxide layer 102 having a plurality of Si dots 104 residing over it. Although the Si dots 104 appear hemispherical in shape here, it will be appreciated that the Si dots 104 can be spherical, oval or amoeba-like in shape. The Si dots 104 can also be made in a variety of sizes with a uniform distribution in particle sizes by appropriate anneal conditions. Although the particles may not be formed in a uniform sphere, they can be described as having a general diameter of approximately 10 Angstroms to 200 Angstroms. An ONO sandwich structure 105 is formed over the Si dots 104. The ONO structure 105 comprises a first oxide layer (first O from ONO) 106 which is disposed conformally over outer surfaces of the Si dots 104, a nitride layer (N) 108 disposed conformally over first oxide layer 106, and a second oxide layer (second O from ONO) 110 disposed conformally over the N layer 108. The second oxide layer has a planar top surface in this example. The thickness 't2' of the second oxide layer 110 is greater than the thickness 't1' of the first oxide layer 106, such that direct tunneling is initiated through the first oxide layer 106 and FN tunneling is initiated through the second oxide layer 110 at a particular fixed electric field. In some embodiments, the thickness t1 of the first oxide layer 106 is less than 30 Angstroms and the thickness t2 of the second oxide layer 110 is less than 250 Angstroms. Thus erase operation comprising both direct tunneling and FN tunneling facilitates fast erasing with good data retention.

Figure 2:
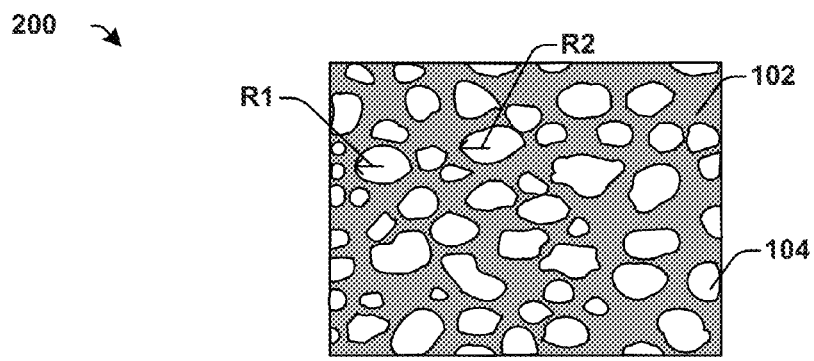
FIG. 2 illustrates a top view of an oxide layer having silicon nano crystals deposited over it, according to some embodiments of the present disclosure.

FIG. 2 illustrates a top view 200 of an oxide layer having silicon nano crystals deposited over it, which corresponds roughly to a top view of FIG. 1's charge trapping structure 100, according to some embodiments of the present disclosure. Tunnel oxide 102 has Si nano crystals 104 formed over it. As mentioned above, the Si dots 104 can be spherical, oval, or amoeba-like in shape. The silicon crystals can be made in a variety of sizes with a uniform distribution in particle sizes by appropriate anneal conditions. Although the particles may not be formed in a uniform sphere, they can be described as having a general radius of approximately 10 Å to 100 Å. R1 and R2 represent two such silicon crystal radii. They can also be formed by chemical vapor deposition, by rapid thermal anneal of amorphous silicon layers or by other known techniques.

Figure 3:
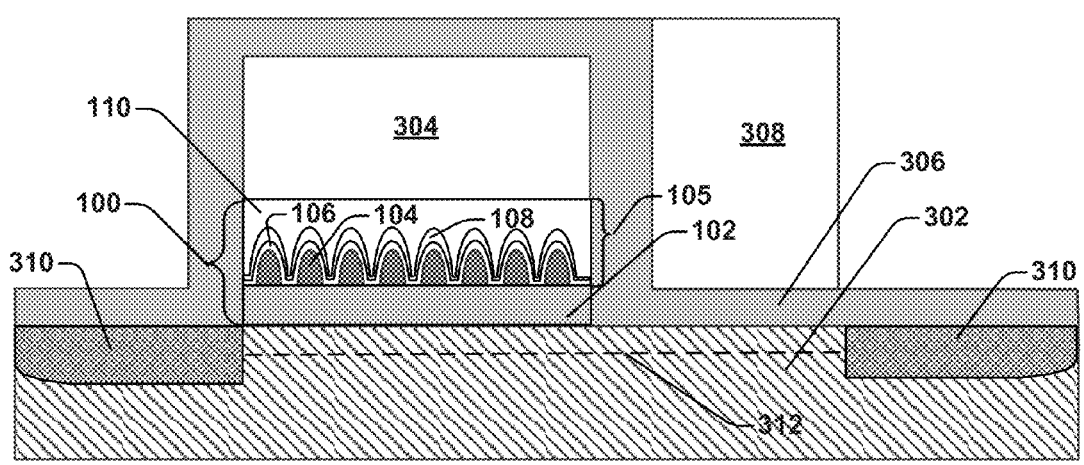
FIG. 3 illustrates a cross sectional view of a flash memory cell having an ONO sandwich structure over a layer of silicon nano crystals, according to some embodiments of the present disclosure.

FIG. 3 illustrates a cross sectional view of a flash memory 300 cell having an ONO sandwich structure 105 over a layer of silicon nano crystals, according to some embodiments of the present disclosure. Memory cell 300 comprises a silicon (Si) substrate 302 which has charge trapping layer 100 formed over it. Memory cell 300 further includes a control gate (CG) 304 over the semiconductor body 100 and a select gate (SG) 308 residing over the Si substrate 302 near a sidewall of the CG 304. A dielectric layer 306 residing over a top surface of the Si substrate 302 separates the CG 304 and the substrate 302 from the SG 308. Furthermore, source/drain (S/D) regions 310 are disposed within the substrate 302 (which are separated by a channel region 312, near opposing sidewalls of the CG 34 and the SG 308.

By changing the amount of charge stored on the Si dots 104, the threshold voltage $V_{th}$ of the memory cell device can be correspondingly changed. For example, to perform a program operation (e.g., write a logical "1") for a cell, the CG 304 is biased with a high (e.g., at least an order of magnitude higher) voltage relative a voltage applied across the channel region and/or relative to a voltage applied to the SG 308. The high bias voltage promotes FN tunneling of carriers from the channel region towards the CG 304. As the carriers tunnel towards the CG through the tunnel oxide 102, the carriers become trapped on the Si dots 104 and alter the $V_{th}$ of the cell. To perform a top erase operation (e.g., write a logical "0") for the cell, the CG 304 is biased with a high (e.g., at least an order of magnitude higher) voltage relative a voltage applied across the channel region and/or relative to a voltage applied to the SG 308. The high bias voltage promotes FN tunneling of carriers from the Si dots 104 towards the CG 304, thereby removing carriers from the Si dots 304 and again changing the $V_{th}$ of the cell in a predictable manner.

Subsequently, during a read operation, a voltage is applied to the SG 308 to induce part of the channel region to conduct. Application of a voltage to the SG 308 attracts carriers to part of the channel region adjacent to the SG 308. While the SG 308 voltage is applied, a voltage greater than $V_{th}$, but less than $V_{th}+\Delta V_{th}$, is applied to the CG 304 (where $\Delta V_{th}$ is a change in $V_{th}$ due to charge trapped on the floating gate). If the memory cell device turns on (i.e., allows charge to flow between S/D regions), then it is deemed to contain a first data state (e.g., a logical "0" is read). If the memory cell device does not turn on, then it is deemed to contain a second data state (e.g., a logical "1" is read).

Since erase operation here comprises top erase, and the top oxide 105 comprises an ONO sandwich structure, the tunneling mechanism here will depend on the thickness of the barriers (oxide layers) and the electric field strength. The first oxide layer 106 creates a potential barrier, thin enough (less than 4 nm) such that electrons will directly tunnel through the first oxide layer 106. After directly tunneling through the first oxide layer 106, electrons fall in to a potential well created by the conduction band of the nitride layer 108. From here, electrons will FN tunnel through a second potential barrier or the second oxide layer 110, which is thicker than the first oxide layer 106. FN tunneling through the thicker second oxide layer 110 will help suppress leakage and sustain data retention whereas direct tunneling through the first oxide layer 106 will enhance erase speed and erase current. The high erase speed also prevents backside FN tunneling through the tunnel oxide 102.

Figure 4A:
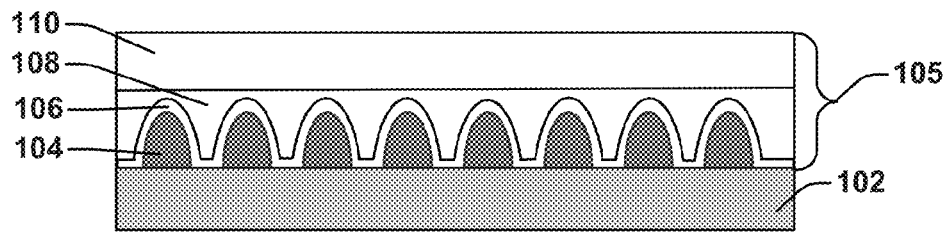
FIGS. 4A-4C illustrate cross sectional views of different embodiments of a charge trapping structure, according to the present disclosure.
Figure 4B:
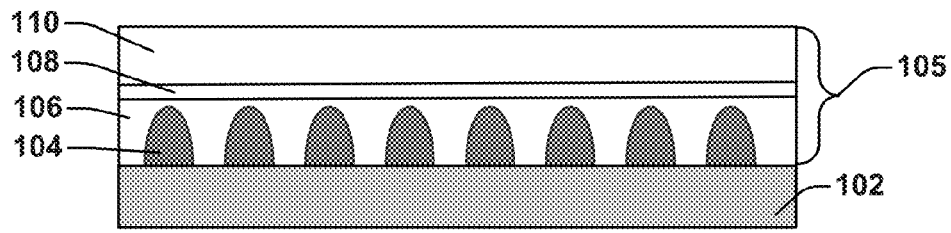
Figure 4C:
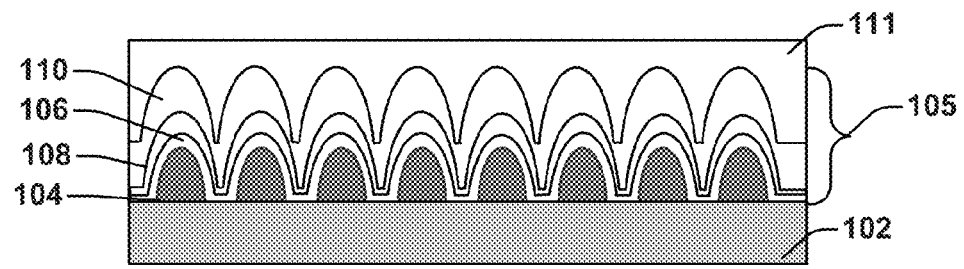

FIGS. 4A-4C illustrate cross sectional views of different embodiments of the charge trapping structure, according to the present disclosure. In one embodiment shown in FIG. 4A, charge trapping structure 400a comprises a first oxide layer 106 which is conformally formed over the Si dots 104. Here, nitride layer 108 is conformally formed over the first oxide layer 106, but has a planar top surface. Hence the second oxide layer 110 formed over the nitride layer 106 has a planar top and bottom surface. In another embodiment shown in FIG. 4B, charge trapping structure 400b comprises a first oxide layer 106 which conformally overlies the Si dots 104 and has a planar top surface. Here the nitride layer 108 residing over the first oxide layer 106 has a planar top and bottom surface. Similarly, the second oxide layer 110 residing over the nitride layer 108 has a planar top and bottom surface. In yet another embodiment shown in FIG. 4C, charge trapping layer 400C comprises a first oxide layer 106 conformally overlying the Si dots 104, a nitride layer 108 conformally overlying the first oxide layer 106 and a second oxide layer 110 conformally overlying the nitride layer 108. Here the second oxide layer 110 has a top surface which follows the shape of the underlying nitride layer 108. A top gate electrode layer 111 overlies the second oxide layer 110.

As will be appreciated in greater detail below, the ONO sandwich structure 105 facilitates top erase through the phenomena of direct tunneling and FN tunneling which enhances erase speed and erase current, reduces backside FN tunneling and improves data retention.

Figure 5:
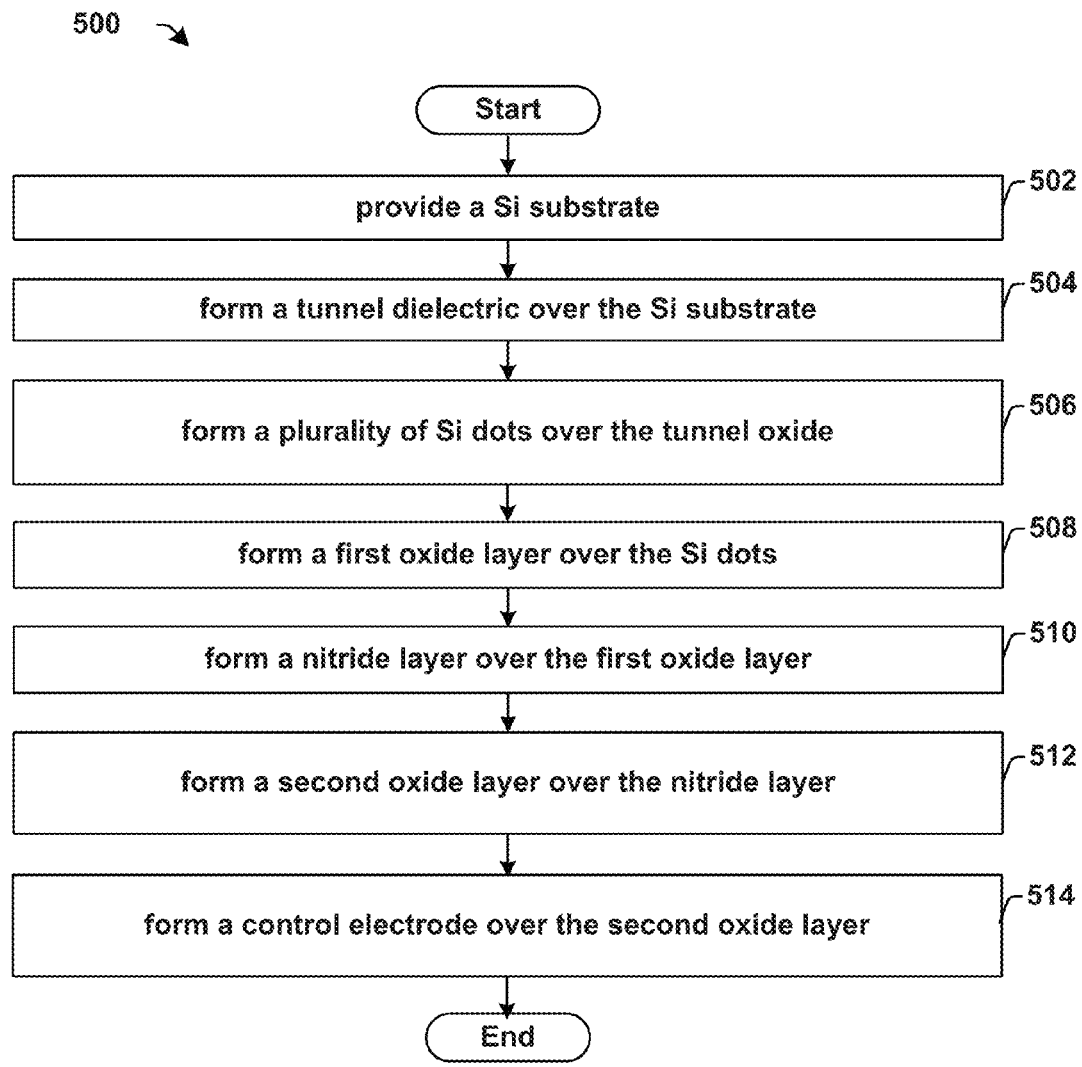
FIG. 5 shows an example of a method in flowchart format in accordance with some embodiments of the present disclosure.

FIG. 5 shows an example of a method 500 in flowchart format in accordance with some embodiments of the present disclosure. While disclosed method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a semiconductor substrate is provided. The substrate can be a bulk semiconductor substrate (e.g., bulk silicon wafer), a binary compound substrate (e.g., GaAs), a ternary compound substrate (e.g., AlGaAs), or higher order compound substrates, among others; but can also be made of non-semiconductor materials, such as glass or sapphire. The substrate can also include a combination of semiconductor material and non-semiconductor material. For example, a bulk semiconductor substrate can also include non-semiconductor materials such as oxide in silicon-on-insulator (SOI), partial SOI substrate, and organic materials, as well as polysilicon, and amorphous silicon, among others. In some embodiments, the substrate can include multiple wafers or dies which are stacked or otherwise adhered together. The substrate can include wafers which are cut from a silicon ingot, and/or any other type of semiconductor/non-semiconductor and/or deposited or grown (e.g. epitaxial) layers formed on an underlying substrate.

At 504, a tunnel dielectric layer is formed over the semiconductor substrate. In some embodiments, the tunnel dielectric comprises $SiO_2$, a low-k dielectric or a high-k dielectric, and the thickness of the tunnel dielectric is less than 100 Angstroms.

At 506, a plurality of Si dots are formed over the tunnel oxide. In some embodiments, the Si dots comprise a radius that is less than 200 Angstroms.

At 508, a first oxide layer is formed over the Si dots. In some embodiments, the first oxide layer comprises SiO2 and the thickness of the first oxide layer is less than 30 Angstroms.

At 510, a nitride layer is formed over the first oxide layer. In some embodiments, the nitride layer comprises SiN and the thickness of the nitride layer is less than 30 Angstroms.

At 512, a second oxide layer is formed over the nitride layer. In some embodiments, the second oxide layer comprises SiO2 and the thickness of the second oxide layer is less than 250 Angstroms.

At 514, a control electrode is formed over the second oxide layer. In some embodiments, the control electrode comprises a metal or poly silicon.

FIGS. 6-10 depict a series of incremental manufacturing steps as a series of 3D views, which are consistent with some implementations of FIG. 4's flowchart.

Figure 6:
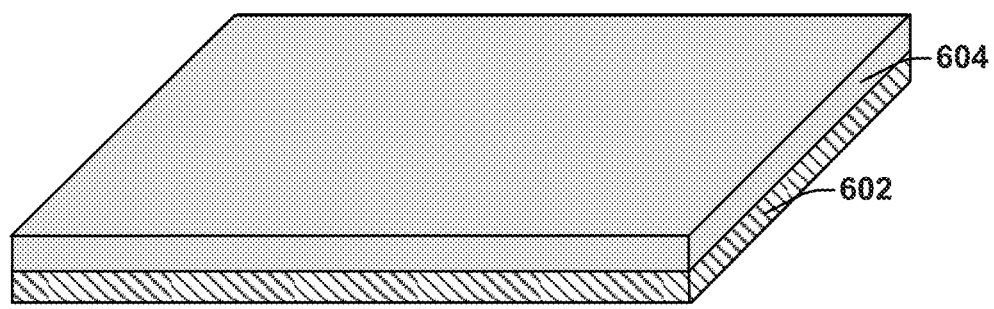
FIGS. 6-10 depict a series of incremental manufacturing steps as a series of 3D views, which are consistent with some implementations of FIG. 5's flowchart.

FIG. 6 illustrates a three dimensional (3D) view of a semiconductor body 600 at one of the stages of forming a semiconductor body with an ONO top oxide structure according to some embodiments of the present disclosure. The semiconductor body 600 includes a semiconductor substrate 602 on which a tunnel oxide layer 604 is formed. In some embodiments, the tunnel oxide layer 604 comprises $SiO_2$ (silicon dioxide) and the thickness of the tunnel oxide layer 604 is less than 100 Angstroms. In some embodiments, the semiconductor substrate 602 can be a bulk silicon substrate, a silicon on insulator (SOI) substrate, a binary semiconductor substrate (e.g., GaAs), tertiary semiconductor substrate (e.g., AlGaAs), or higher order semiconductor substrate, for example. Any of these substrates can include doped regions formed in the substrate, one or more insulating layers formed in or on the substrate, and/or conducting layers formed in or on the substrate.

Figure 7:
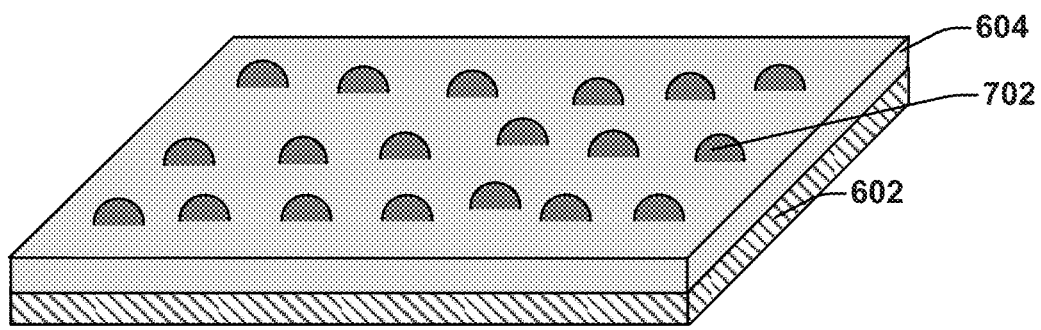

FIG. 7 illustrates a 3D view of a semiconductor body 700 having Si nano crystals or Si dots 702 disposed over the tunnel oxide 604. The Si dots 702 can be made in a variety of sizes with a uniform distribution in particle sizes. Although the particles are not necessarily uniform spheres, they can be described as having a general radius of approximately 10 Å to 100 Å. They can be formed by chemical vapor deposition, by rapid thermal anneal of amorphous silicon layers or by other known techniques.

Figure 8:
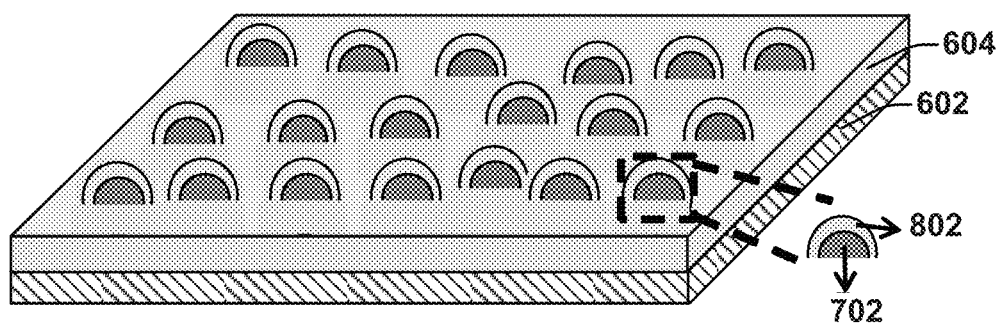

FIG. 8 illustrates a 3D view of a semiconductor body 800 having a first oxide layer 802 formed conformally over the Si dots 702. In some embodiments, the first oxide layer is formed by oxidizing Si dots by NO (nitrogen monoxide), $O_2$ (oxygen) or $N_2O$ (nitrous oxide), or by oxide deposition by ALD (atomic layer deposition) process. In some embodiments, the first oxide layer 802 comprises $SiO_2$ and the thickness of the first oxide layer 802 is less than 30 Angstroms. During erase operation, electrons from the Si dots 702 tunnel through the first oxide layer 802 by direct tunneling and this helps increase the erase speed and erase current of the memory cell.

Figure 9:
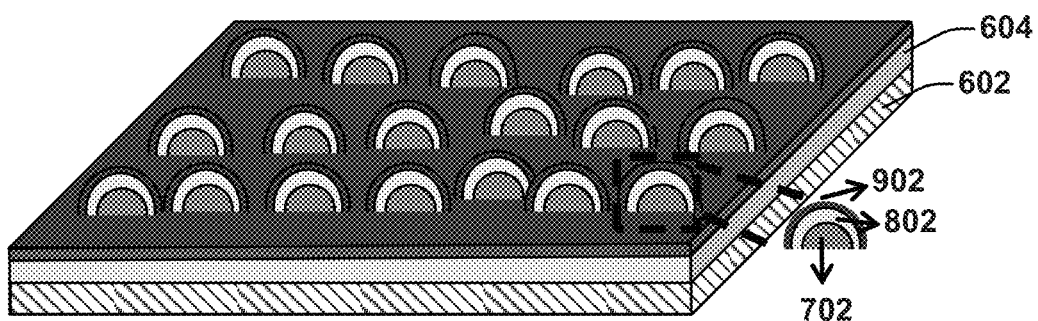

FIG. 9 illustrates a 3D view of a semiconductor body 900 having a nitride layer 902 formed conformally over the first oxide layer 802. In some embodiments, the nitride layer 902 is formed by plasma nitration by DPN (decoupled plasma nitration) or nitride deposition by ALD process. In some embodiments, the nitride layer 902 comprises SiN (silicon nitride) and the thickness of the nitride layer 902 is less than 30 Angstroms.

Figure 10:
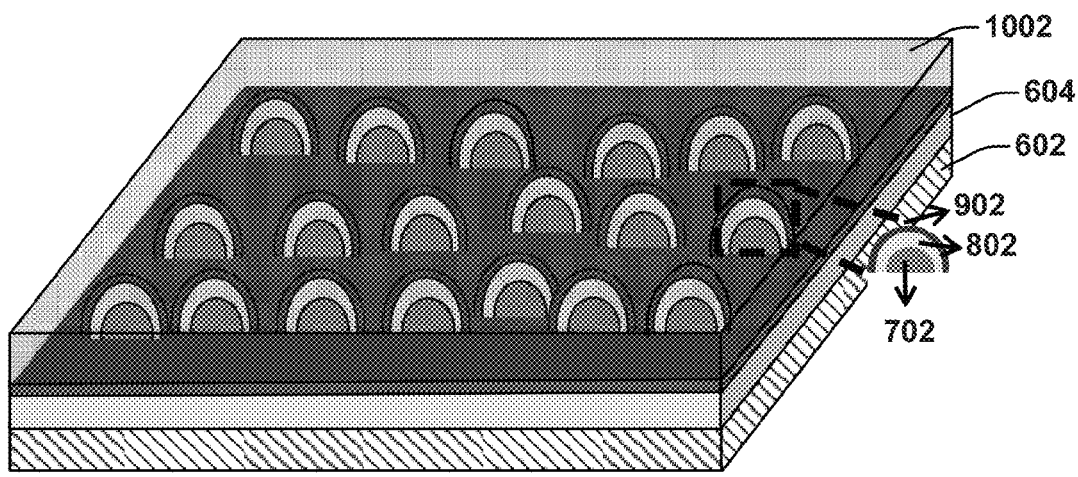

FIG. 10 illustrates a 3D view of a semiconductor body 1000 having a second oxide layer 1002 formed conformally over the nitride layer 902. In some embodiments, the second oxide layer 1002 is formed by thermal oxidation or by oxide deposition using ALD (atomic layer deposition) process. In some embodiments, the second oxide layer 1002 comprises SiO2 and the thickness of the second oxide layer 1002 is less than 250 Angstroms. During erase operation, electrons from the Si dots 702 tunnel through the second oxide layer 1002 by FN tunneling and this helps improve data retention.

After formation of the ONO structure or second oxide layer 1002, a control electrode is formed over it. In some embodiments, a control electrode layer is deposited over the second oxide layer, and with a protective mask in place, an etching process is carried out to carefully pattern the layers and form a control electrode structure. In some embodiments, the control electrode comprises a metal or poly silicon. After formation of the control electrode or control gate (CG), a select gate (SG) is formed near a sidewall of the CG. Even though the above mentioned process illustrates a CG first process, it will be appreciated that this disclosure is applicable to a SG first process flow, where a SG is formed first, followed by the formation of a CG. In both embodiments, i.e., in a CG first process or SG first process, a dielectric layer separates the CG from the SG.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a structure and method for forming a SG TFS embedded flash memory cell having an ONO sandwich structure as top oxide over a plurality of charge trapping quantum dots. The ONO structure helps improve erase speed without data retention degradation and reduce backside FN tunneling under the same erase speed. During erase operation, electrons undergo direct tunneling through the first oxide layer of the ONO structure and undergo FNT through the second oxide layer of the ONO structure. Direct tunneling helps with increasing erase speed and erase current at a low electric field and FNT helps improve data retention and prevent backside FNT under the same low electric field.

In some embodiments, the present disclosure relates to a flash memory cell comprising a semiconductor substrate, a tunnel oxide layer disposed over the semiconductor substrate, a plurality of quantum dots disposed over the tunnel oxide layer, and an ONO sandwich structure disposed over the plurality of quantum dots.

In another embodiment, the present disclosure relates to a split gate flash memory cell comprising a silicon (Si) substrate, source and drain regions disposed within the Si substrate, wherein a channel region is defined between the source and drain regions, a tunnel oxide layer disposed over a specific region of the channel region, a plurality of Si dots disposed over the tunnel oxide layer, an ONO sandwich structure disposed over the Si dots, a control gate (CG) disposed above the ONO sandwich structure, a gate dielectric arranged over an upper surface and sidewall of the CG, and a select gate (SG) arranged near the sidewall of the CG and over the gate dielectric, wherein the SG is separated from the CG by the gate dielectric.

In yet another embodiment, the present disclosure relates to a method of forming a split gate flash memory cell comprising, providing a semiconductor substrate, forming a tunnel oxide layer over the semiconductor substrate, forming plurality of Si dots over the tunnel oxide layer, forming a first oxide layer over the Si dots, forming a nitride layer over the first oxide layer, and forming a second oxide layer over the nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flash memory cell comprising:
a semiconductor substrate;
a tunnel oxide layer disposed over the semiconductor substrate;
a plurality of quantum dots disposed over the tunnel oxide layer; and
an ONO sandwich structure disposed over the plurality of quantum dots;
wherein the ONO sandwich structure comprises:
a first oxide layer disposed above the plurality of quantum dots,
a nitride layer disposed above the first oxide layer, and
a second oxide layer disposed above the nitride layer,
wherein the second oxide layer is thicker than the first oxide layer.

2. The flash memory cell of claim 1, wherein the first oxide layer conformally overlies the plurality of quantum dots.

3. The flash memory cell of claim 1, wherein the nitride layer conformally overlies the first oxide layer.

4. The flash memory cell of claim 1, wherein the second oxide layer conformally overlies the nitride layer.

5. The flash memory cell of claim 1, wherein:
the semiconductor substrate comprises Si;
the plurality of quantum dots comprise Si nano crystals;
the first and the second oxide layers comprise SiO2 (silicon dioxide); and
the nitride layer comprises silicon nitride.

6. The flash memory cell of claim 1, further comprising:
a source region and a drain region disposed within the semiconductor substrate;
a control gate (CG) disposed above the ONO sandwich structure and arranged between the source and drain regions;

a select gate (SG) disposed over the semiconductor substrate near a sidewall of the CG; and a dielectric layer disposed over a top surface of the semiconductor substrate and along sidewalls of the CG, the dielectric layer separating the CG from the SG and separating the SG from the semiconductor substrate.

7. The flash memory cell of claim 1, wherein a quantum dot is substantially hemispherical in shape, and has a radius less than 100 Angstroms.

8. The flash memory cell of claim 1, wherein charge carriers undergo direct tunneling through the first oxide layer and charge carriers undergo Fowler-Nordheim (FN) tunneling through the second oxide layer.

9. The flash memory cell of claim 1, wherein the second oxide layer is thicker than the first oxide layer by more than a factor of two.

10. A split gate flash memory cell comprising:
a silicon (Si) substrate;
source and drain regions disposed within the Si substrate, wherein a channel region is defined between the source and drain regions;
a tunnel oxide layer disposed over the channel region;
a plurality of Si dots disposed over the tunnel oxide layer;
an ONO sandwich structure disposed over the plurality of Si dots, wherein the ONO sandwich structure comprises:
  a first oxide layer comprising $SiO_2$;
  a nitride layer comprising silicon nitride disposed above the first oxide layer; and
  a second oxide layer comprising $SiO_2$ disposed above the nitride layer,
wherein the second oxide layer is thicker than the first oxide layer;
a control gate (CG) disposed above the ONO sandwich structure;
a gate dielectric arranged over an upper surface and sidewall of the CG; and
a select gate (SG) arranged near the sidewall of the CG and over the gate dielectric, wherein the SG is separated from the CG by the gate dielectric.

11. The split gate flash memory cell of claim 10, wherein the Si dots are spherical, hemi-spherical, oval or amoeba-like in shape.

12. The split gate flash memory cell of claim 11, wherein:
the first oxide layer is conformal over outer surfaces of the Si dots;
the nitride layer is conformal over an outer surface of the first oxide layer; and
the second oxide layer is conformal over an outer surface of the nitride layer.

13. The split gate flash memory cell of claim 10, wherein the second oxide layer is thicker than the first oxide layer by more than a factor of two.

14. The split gate flash memory cell of claim 10, wherein:
a thickness of the tunnel oxide layer is less than 100 Angstroms;
a thickness of the first oxide layer is less than 30 Angstroms;
a thickness of the nitride layer is less than 30 Angstroms; and
a thickness of the second oxide layer is less than 250 Angstroms.

15. A method of forming a split gate flash memory cell comprising:
providing a semiconductor substrate;
forming a tunnel oxide layer over the semiconductor substrate;
forming plurality of Si dots over the tunnel oxide layer;
forming a conformal first oxide layer over the plurality of Si dots;
forming a conformal nitride layer over the conformal first oxide layer; and
forming a second conformal oxide layer over the conformal nitride layer, wherein the second conformal oxide layer is thicker than the first oxide layer.

16. The method of claim 15 further comprising:
forming a control gate (CG) over the second oxide layer;
forming a select gate (SG) over the Si substrate near a sidewall of the CG;
forming a dielectric layer over the semiconductor substrate that separates the CG from the SG and the semiconductor substrate from the SG; and
forming source and drain regions within the semiconductor substrate near opposing sidewalls of the CG and the SG.

17. The method of claim 15, wherein:
thickness of the tunnel oxide layer is less than 100 Angstroms;
thickness of the first oxide layer is less than 30 Angstroms;
thickness of the nitride layer is less than 30 Angstroms; and
thickness of the second oxide layer is less than 250 Angstroms.

18. The method of claim 16, wherein:
the semiconductor substrate comprises Si;
the first and second oxide layers comprise SiO2 (silicon dioxide);
the nitride layer comprises silicon nitride; and
the CG and SG comprise poly silicon or metal.

19. The method of claim 15, wherein the first and second oxide layers are formed by oxide deposition by ALD (atomic layer deposition), thermal oxidation or oxidation by NO, O2 or N2O.

20. The method of claim 15, wherein the second oxide layer is thicker than the first oxide layer by more than a factor of two.

* * * * *